United States Patent
Zanchi

(10) Patent No.: US 8,723,554 B2
(45) Date of Patent: May 13, 2014

(54) HIGH-STABILITY RESET CIRCUIT FOR MONITORING SUPPLY UNDERVOLTAGE AND OVERVOLTAGE

(75) Inventor: Alfio Zanchi, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 0 days.

(21) Appl. No.: 13/294,051

(22) Filed: Nov. 10, 2011

(65) Prior Publication Data
US 2013/0120026 A1 May 16, 2013

(51) Int. Cl.
*H03K 5/22* (2006.01)

(52) U.S. Cl.
USPC .................................. 327/77; 327/85; 327/87

(58) Field of Classification Search
USPC .......... 327/77, 78, 80, 81, 85, 87, 88; 361/90, 361/91.1, 92
See application file for complete search history.

(56) References Cited

U.S. PATENT DOCUMENTS

| | | | |
|---|---|---|---|
| 3,789,242 A | 1/1974 | Cantor | |
| 4,309,627 A * | 1/1982 | Tabata | 327/81 |
| 5,070,295 A | 12/1991 | Morigami | |
| 5,136,181 A | 8/1992 | Yukawa | |
| 5,959,477 A | 9/1999 | Chung | |
| 6,144,237 A | 11/2000 | Ikezaki | |
| 6,847,240 B1 | 1/2005 | Zhou | |
| 8,102,168 B1 * | 1/2012 | Wong | 327/143 |
| 2008/0079467 A1 * | 4/2008 | Hou | 327/143 |
| 2009/0102522 A1 | 4/2009 | Tang et al. | |
| 2009/0219066 A1 * | 9/2009 | Shkidt | 327/143 |
| 2010/0225300 A1 * | 9/2010 | Lyles et al. | 324/76.11 |

* cited by examiner

*Primary Examiner* — Long Nguyen
(74) *Attorney, Agent, or Firm* — William J. Kubida; Peter J. Meza; Hogan Lovells US LLP

(57) ABSTRACT

A method of monitoring supply voltage includes providing a single reference voltage, providing a single ratioed supply voltage, comparing the reference voltage to the ratioed supply voltage to provide an output signal, wherein the output signal comprises a first logic value in first and second operating conditions, and a second logic value in a third operating condition, wherein the first, second, and third operating conditions are determined by two crossing points of the reference voltage and ratioed supply voltage characteristics. The first and second operating conditions can represent undervoltage and overvoltage conditions, and the third operating condition can represent a normal operating condition. The reference voltage can be provided by a bandgap reference circuit.

24 Claims, 4 Drawing Sheets

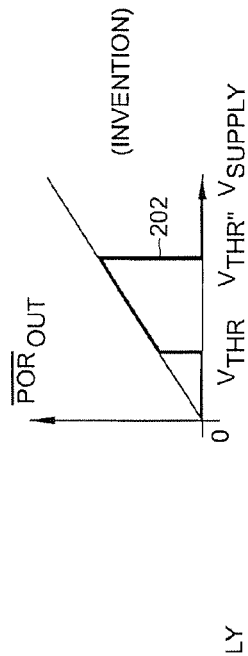
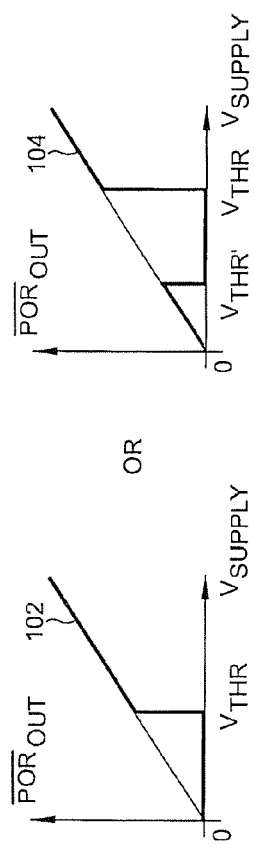
Fig. 1 PRIOR ART
Fig. 2
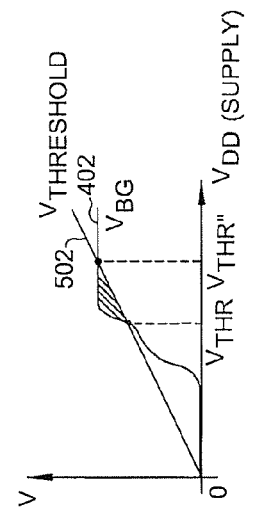
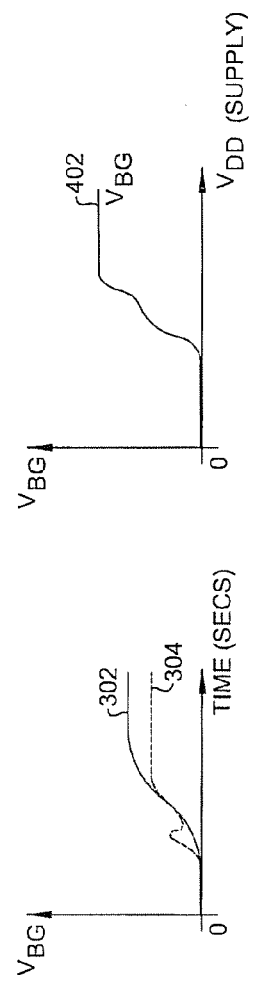
Fig. 3 PRIOR ART
Fig. 4 PRIOR ART
Fig. 5

HIGH-STABILITY RESET CIRCUIT FOR MONITORING SUPPLY UNDERVOLTAGE AND OVERVOLTAGE

BACKGROUND OF THE INVENTION

1. Field of the Invention

The present invention relates to power-on reset and voltage supply monitoring integrated circuits.

2. Description of the Related Art

Virtually every digital and mixed-signal (digital/analog) electronic and electrical system faces the problem of the initial indetermination of its state, when the power is ramped from zero volts to its nominal value. A common solution that has spurred a plethora of prior art is the adoption of a so-called power-on reset (P.O.R.) circuit, that can monitor the level of one or more supply lines, and issue a digital "reset" signal to initialize the digital circuitry and in particular any finite state machines (FSMs) present inside the system. Solutions have been devised that rely on the simplest voltage divider and Schmitt trigger approach, cited as prior art by e.g. Yukawa (U.S. Pat. No. 5,136,181); often complemented by a more complicated but digital-like, supply-referred CMOS solution such as found in Yukawa, or Ikezaki (U.S. Pat. No. 6,144,237). Other approaches recognize the limitations of a CMOS-only implementation, susceptible to V-threshold shifts and referred to the power rail; and those less temperature-stable while more process-dependent. Those solutions adopt self-compensating circuits such as variants of the bandgap reference block, where the temperature dependence of a p-n junction's $\Delta V$ ($\Delta V_{BE}$ for the bipolar transistor case, or simple $\Delta V_D$ for the diode case) which is approximately $-2$ mV/°C. due to inherent physical properties of silicon, gets compensated by an Ohmic drop I·R of a PTAT (Proportional To Absolute Temperature) current flowing into a resistor featuring minimal, or often even advantageous, sheet resistivity p dependence on temperature. Being based on inherent semiconductor properties, this approach also is less susceptible to process shifts, which—in case they affect the resistors, for example, in the $\Delta V_D + R \cdot I = V_{constant}$ mesh voltage balance outlined above—can easily be trimmed by laser, fuses, E²PROM-based techniques at the inception of the circuit's product life in the factory. Such general approach to define a suitable and most invariant reference voltage against which the power supply can be compared has been either modified or cited as prior art by e.g. Zhou (U.S. Pat. No. 6,847,240) and Morigami (U.S. Pat. No. 5,070,295, using diode/resistor combinations); or also by Tang et al. (US Patent Publication No. 2009/0102522), Chung (U.S. Pat. No. 5,959,477), and Hou (US Patent Publication No. 2008/0079467), which use a more classic configuration of the bipolar-based bandgap cell. One advantage of such idea is the fact that a bandgap-reference integrated circuit is very commonplace in a number of precision circuits, such as A-to-D and D-to-A data converters where the analog signal has respectively to be weighted, and synthesized, with respect to a stable, accurate, and precise voltage reference (see e.g. cited Zanchi patents regarding voltage reference systems); or data acquisition front-ends equipped with a variable-gain amplifier (VGA) where the relative strength of the input signal is object of comparison against a full-scale level to be maintained constant.

The purpose of the POR circuit is to signal when the lower supply rail has reached a suitable operational voltage, that allows the digital logic to work reliably as expected. With the exception of Ikezaki, where the POR output is not issued for $V_{supply}$ close to 0, all the other prior arts known to the inventor are either issuing a POR signal when the $V_{supply}$ is less than a certain threshold; or issuing a finite time-pulse when the POR circuit determines a threshold of "acceptable voltage" has been exceeded. When the implementation itself is not conducive to such voltage characteristic, such as in Hou and as outlined by Zhou with regards to previous prior art, such anomaly is removed by means of additional "gating" circuitry (Hou) or by modifying the electrical configuration of the circuit (Zhou).

What is desired is a simple POR circuit and method of operation that can provide indications of undervoltage, overvoltage, and normal operating conditions that is suitable for use on integrated circuits.

SUMMARY OF THE INVENTION

According to the present invention, a method of monitoring supply undervoltage and overvoltage includes providing a single reference voltage, providing a single ratioed supply voltage, comparing the reference voltage to the ratioed supply voltage to provide an output signal, wherein the output signal comprises a first logic value in an undervoltage and an overvoltage condition, and a second logic value in a normal operating condition. The reference voltage can be a bandgap voltage. The undervoltage condition is a condition wherein the reference voltage is less than the ratioed supply voltage for voltages up to a first voltage crossing of the reference voltage and the ratioed supply voltage characteristics. The first voltage crossing occurs during a transitional phase of the static characteristic of the reference voltage. The overvoltage condition is a condition wherein the reference voltage is less than the ratioed supply voltage for voltages greater than a second voltage crossing of the reference voltage and the ratioed supply voltage characteristics. The second voltage crossing occurs during either a transitional phase or an invariant phase of the reference voltage characteristic against the supply voltage being monitored. The normal operating condition is a condition wherein the reference voltage is instead greater than the ratioed supply voltage, i.e. for voltages between a first voltage crossing and a second voltage crossing of the reference voltage and the ratioed supply voltage characteristics.

The method of the present invention is performed without a clock. The reference voltage is reference voltage that can be shared with at least one other component in an integrated circuit and is an unswitched reference voltage. Comparing is performed by a single comparator having a first input directly coupled to the ratioed supply voltage and a second input directly coupled to the reference voltage. Comparing can include hysteresis. Additional delay and/or output signal processing can be performed.

In a circuit embodiment, the reference voltage can be provided by a mixed bipolar and MOS bandgap reference circuit, or by a bipolar bandgap reference circuit having substrate PNP devices. Other bandgap or reference circuits may also be used.

The circuit and method of the present invention may be used on any mixed-signal (analog and digital) circuits with a stable bandgap reference and sensitivity to both undervoltage (for reasons of functionality) and overvoltage (for reasons of reliability).

BRIEF DESCRIPTION OF THE DRAWINGS

FIG. 1 contains two plots of an inverted POR signal with respect to supply voltage as is known in the prior art;

FIG. 2 is a plot of another inverted POR signal with respect to supply voltage according to the present invention;

FIG. 3 is a plot of the startup voltage characteristics for two prior art voltage monitoring circuits;

FIG. 4 is a plot of the static bandgap voltage versus supply voltage as is known in the prior art;

FIG. 5 is a plot of the threshold voltage characteristic intersecting the bandgap voltage characteristic at two distinct threshold voltages according to the present invention;

DETAILED DESCRIPTION

Figure 6:
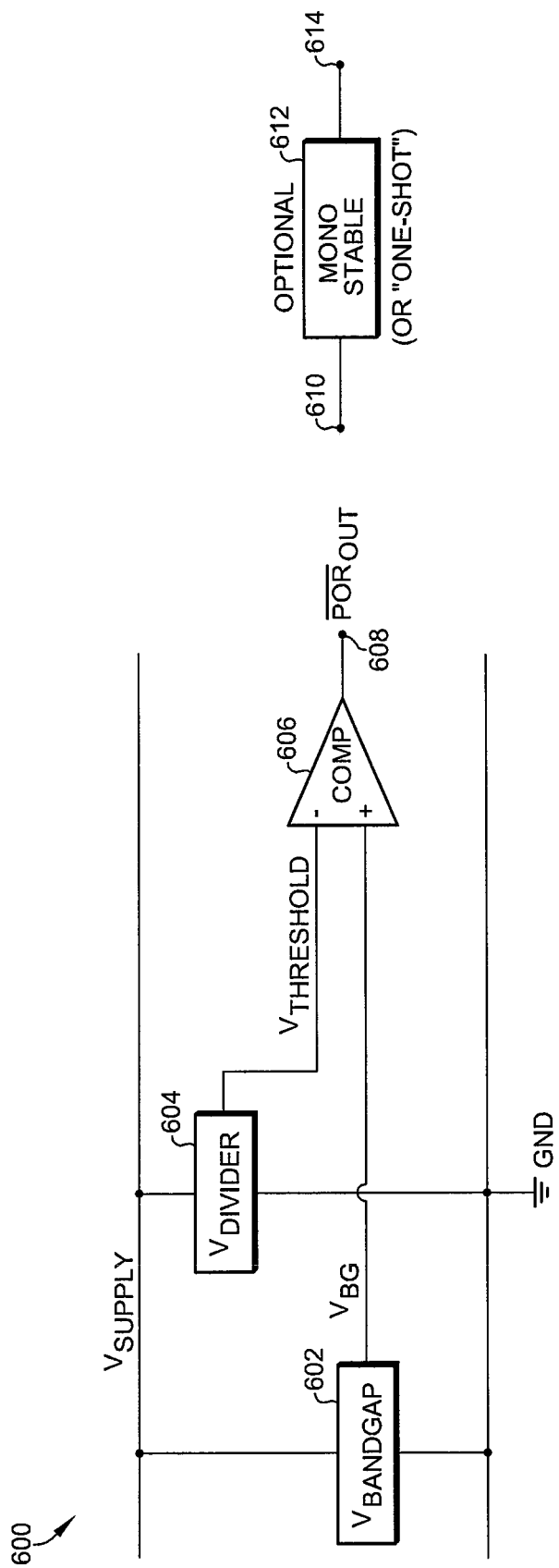
FIG. 6 is a schematic of a power-on reset circuit suitable for indicating the undervoltage, overvoltage, and normal operating voltage conditions based upon the two distinct threshold voltages of FIG. 5 according to the present invention.

The purpose of the present invention is to leverage the most stable POR configuration so far existent in the state of the art, i.e. the bandgap-based power-on reset circuit, to not only provide a signal that identifies when a suitable level for the $V_{supply}$ has been reached; but to provide, in addition, a means to signal when a suitable level for the $V_{supply}$ has been exceeded. In such paradigm, the digital logic that controls the rest of the I.C. or S.o.C., not only can be reset, initialized, and further on activated when $V_{supply}$ is high enough; but it can be configured to enter a protective (and self-protective) mode of operation when $V_{supply}$ is excessive, such as in case of power overshoot, surge due to AC-line instability, sudden shorts with a higher voltage rail, or load-dump transient for voltage-regulated subsystems (such as driven by a Low Drop Out regulator, LDO). Referring now to FIG. 1, the usual output signal characteristics 102 or 104 (to Ikezaki) of a prior-art POR circuit is then modified to the output signal characteristic 202 in FIG. 2 of another POR circuit according to the teachings of the present invention.

Referring now to FIG. 2, the output signal characteristic 202 according to the present invention is shown. $V_{THR}$ is chosen so as $V_{supply} > V_{THR}$ guarantees an operationally reliable voltage for the circuit; $V_{THR}"$ is chosen so as $V_{supply} < V_{THR}"$ does not constitute a reliability concern for the circuit at hand. The overvoltage protection is desirable for example to prevent the I.C.'s overheating (in most instances, a rise in $V_{supply}$ determines a super-linear rise in I supply which ends up destroying the part for long $V_{supply}$ transients, especially in BICMOS or bipolar circuits subject to thermal runaway and $2^{nd}$ order breakdown), which is particularly true in power stages subject to tight SOA (Safe Operating Area) requirements. But in the most aggressive digital technology implementations, sub-100 nm CMOS for example, the degree of TDDB (Time-Dependent Dielectric Breakdown) and in general of GOI (Gate-Oxide Integrity) susceptibility is greatly exacerbated, to the point where the life-time specification of the product can be significantly shortened for even short intervals of supply overvoltage, corresponding to power-rail failure episodes. The case is worse for continuous-time constant overvoltage; but process specifications de-rate their devices' lifetimes against the sum of time intervals in which the circuit has been exposed to overstress, clearly indicating the need for a circuit that could detect even brief, temporary events.

For aerospace application, where the lifetime of the part is much longer than for commercial applications, as well as in military applications where supply overvoltages can occur as a consequence of deliberate attacks, this sort of protection is extremely valuable. Moreover, for the case of subsystems internally supplied by down-conversion voltage regulators (like single-supply parts using dual- or triple-gate technology, e.g. 3.3V/1.8V gate oxide thicknesses), radiation events such as heavy-ion hits can easily upset internal nodes to the regulator, causing substantial destabilization of the LDO or other equivalent regulation loop, that can cause the output voltage to rail to the undesirable higher voltage for extended periods of time.

Therefore, unlike most state of the art available, the invention not only issues a POR signal upon an under/overvoltage event, but maintains the $\overline{POR}$ signal active for the whole duration of the events, and provides a warning signal for some time after the cessation of the offending event for added security. Notice how, also in the previous figure, $\overline{POR}$ has been plotted; in fact, when the supply is zero or very low, $\overline{POR}$ can only be zero—which to a fully-powered external system still reads "POR condition detected" correctly.

Notice too that supply voltage levels considered suitable for normal circuits could instead engender overvoltage stress for voltage-multiplied circuits such as charge pumps and bootstrap blocks, whose sensitive nodes could be locally equipped with the POR/monitoring circuit to be disclosed in the invention.

The earlier prior art for overvoltage/undervoltage detection circuitry such as Cantor (U.S. Pat. No. 3,789,242) does not rely on a precise and stable bandgap voltage reference, but only on voltage comparisons and diode thresholds: which is very unreliable in integrated monolithic implementations. The same principle already exploited in the POR regulation in prior art can instead be conveniently extended to determine the additional "malfunction zone" outlined in the previous figure. As described respectively in Hou and Zhou, the startup characteristics 302 and 304 of a conventional bipolar or diode-based bandgap reference against time are shown in FIG. 3.

Since the curves 302 and 304 shown in FIG. 3 have been simulated or measured by their respective inventors against a supply voltage ramp, linear with time, in reality such curves can be proven to be proportional to the static voltage "transfer function" $V_{DD} \rightarrow V_{BG}$ of the bandgap cell as is shown in curve 402 of FIG. 4.

FIG. 4 can be complemented with the corresponding $V_{threshold}$ level 502, as shown in FIG. 5, that will be proportional to $V_{DD}$ via a temperature-independent and process-independent method of adjustment such as a simple resistive division, which determines $V_{THR}$ and $V_{THR}"$:

Notice that separate straight lines can be adopted to intercept the $V_{BG}$ ($V_{DD}$) characteristic at the desired $V_{THR}$, $V_{THR}"$ voltages; and—although such technique can accommodate non-monotonicity of the transfer curve such as the one in Zhou—different R-ladders and comparators will be needed. Instead, a most advantageous case of monotonic $V_{BG}$ ($V_{DD}$) has been devised and simulated: in such case, one single comparator produces the desired $\overline{POR}$ output, which does not require additional digital logic, minimizing the number of radiation-prone devices needed for a minimal realization of the invention.

Referring to FIG. 6, a circuit 600 is shown that is capable of providing a power-on reset signal at node 608 that provides a logic zero in an undervoltage and overvoltage condition, and a logic one in a normal operating condition using the two distinct threshold voltages according to the present invention. The circuit includes a single bandgap circuit 602, a resistor divider 604, a single comparator 606, and an output node 608. The bandgap circuit 602 can be shared with other components on the same integrated circuit. Circuit 600 is not clocked or switched as is described in further detail below.

After the comparator, some form of edge-activated monostable circuit 612 having an input 610 coupled to node 608 and an output 614 can be adopted to prolong the $\overline{POR}$ signal for a suitable time, for example transforming a quick violation of the allowed supply voltage "window" into a pulse of a time duration sufficient to enable digital processing. Notice however how the bandgap 602 does not require to be switched (as in Tang et al.); nor coupled to topologically similar post-processing stages (Chung); nor windowed through other circuits (Hou, Zhou). The constant characteristic of the $V_{BG}$ level for higher $V_{DD}$ levels guarantees the existence of a second intercept point $V_{THR}''$; while the first intercept point derives from the "S-shaped" nature of the curve. The closest prior art to the proposed implementation is by Lyles et al. (US Patent Publication No. 2010/0225300), which indeed adopts the same bandgap/comparator arrangement and POR output convention, but it is switched, unlike the present invention. Although it also makes use of a single comparator, such solution requires to switch the bandgap between two states: that is, prevents the bandgap cell from being used for other blocks of the circuitry, requiring de facto a dedicated bandgap for the POR alone. The necessity of switching the $V_{BG}$ characteristic "ON" and "OFF" is not presently used in the invention; since the intersection of the $V_{BG}$ ($V_{DD}$) and the $V_{threshold}$ ($V_{DD}$) curves automatically satisfies the requirements for under-voltage and over-voltage protection.

Figure 7:
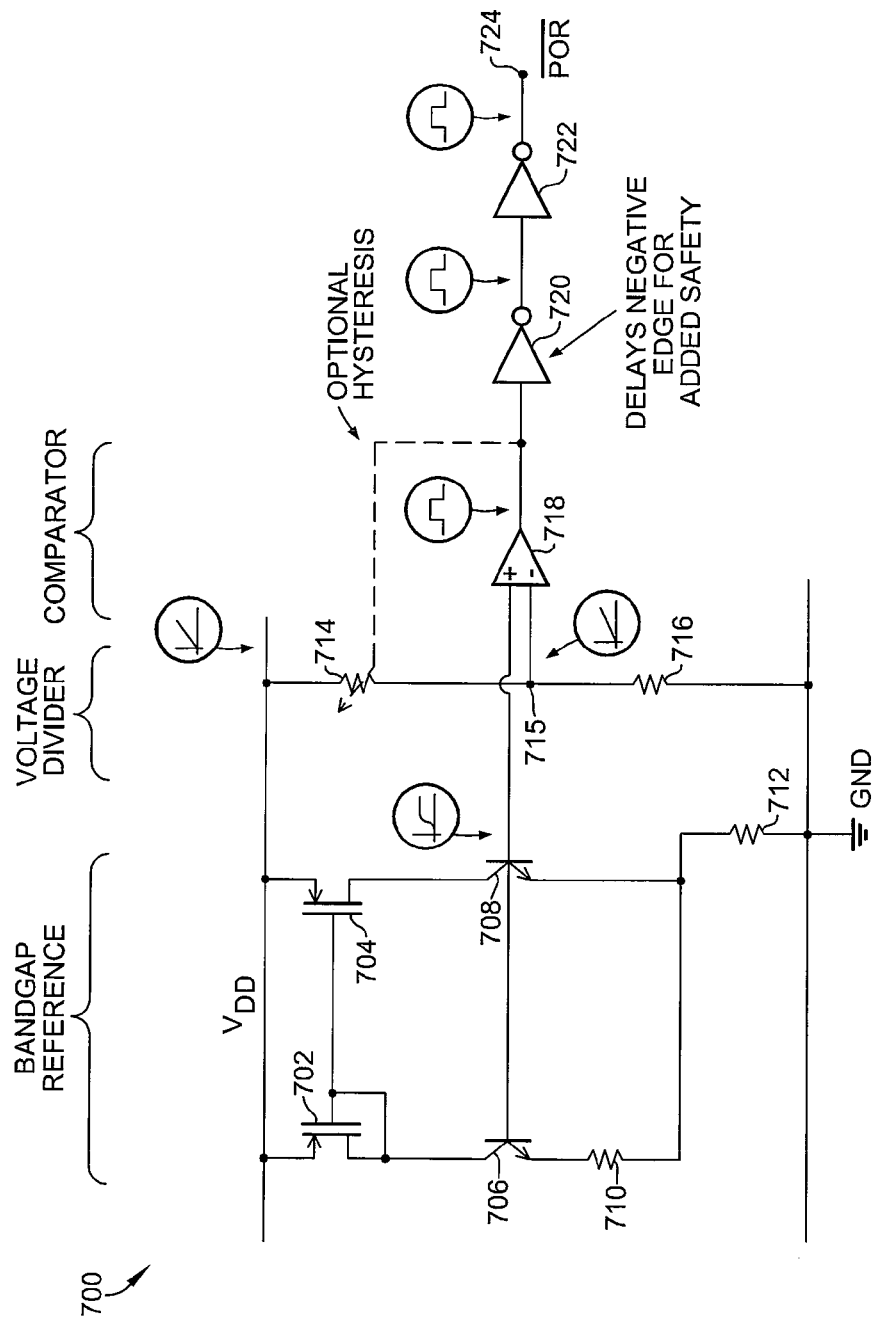
FIG. 7 is a schematic of a first transistor-level implementation of the circuit of FIG. 6.

A transistor-level realization of the circuit 600 corresponding to the block diagram presented in the previous FIG. 6 is provided in the next schematic 700 of FIG. 7. The circuit 700 of FIG. 7 includes PMOS devices 702 and 704, NPN bipolar devices 706 and 708, and resistors 710, 712, 714, and 716. Resistor 714 can be made variable to provide optional hysteresis. Comparator 718 has a positive input coupled to the bases of transistors 706 and 708, and a negative input coupled to the output of the voltage divider at node 715. Optional inverters 720 and 722 can be interposed between the output of comparator 718 and the inverted POR signal at node 724. The NPN bipolar nature of the bandgap cell can of course be identically substituted by usage of PNP, diodes, or—as also advocated by Lyles—by a Zener diode current (provided the slope of the characteristic, now no longer "S-shaped" but rather a "saturation" curve, is compatible with the slope of the voltage divider generating $V_{threshold}$).

Figure 8:
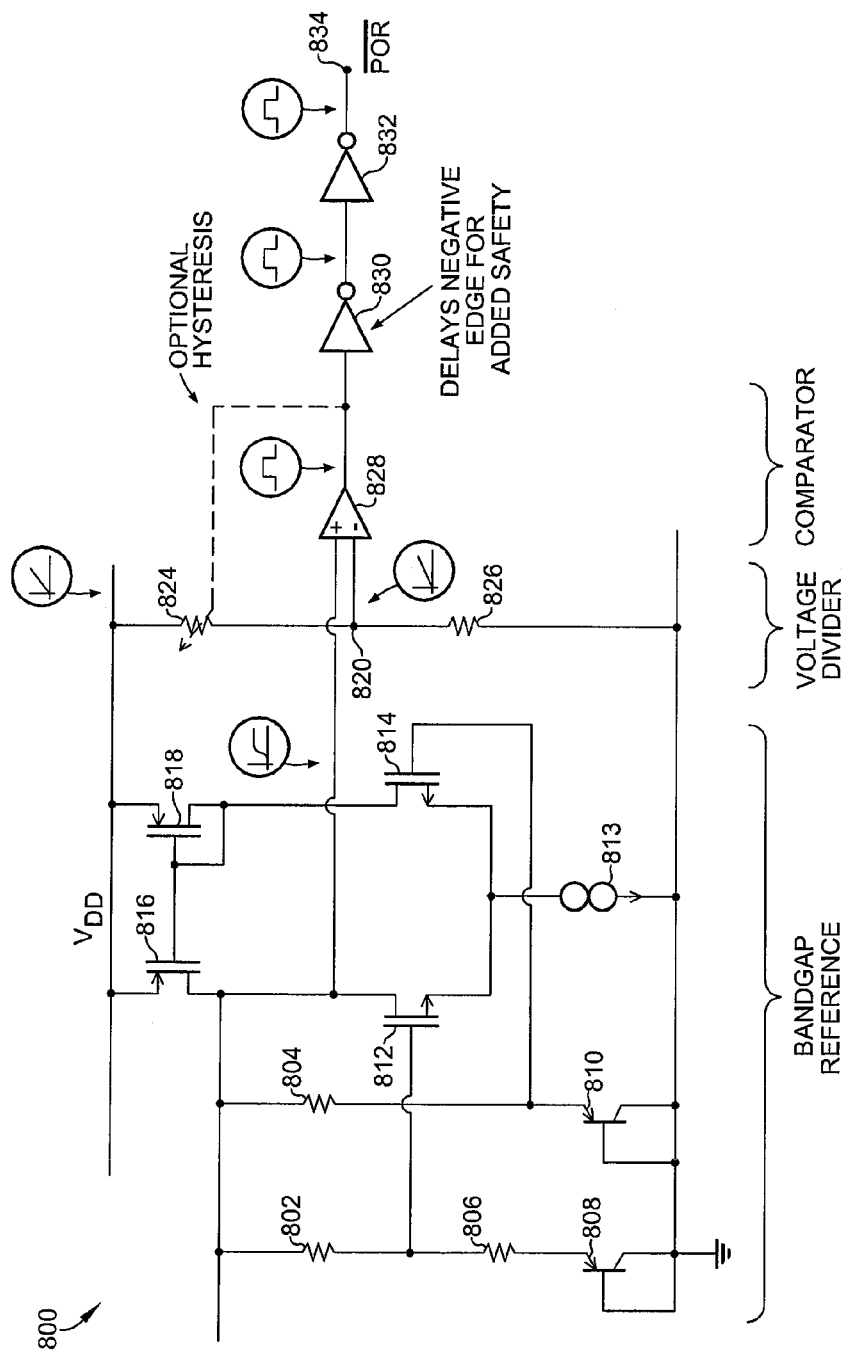
FIG. 8 is a schematic of a second transistor-level implementation of the circuit of FIG. 6 with improved rejection to supply variations.

Two-stage bandgaps add resiliency against the comparator's kick-back phenomenon; $V_{DD}$-independent bandgaps offer better "S-shape" turn-on characteristics and provide improved PSRR as compared to the previous embodiment, which—in a context of POR applications having glitching supply—can be important. A detail of a PNP-diode schematic is proposed in the final implementation, shown in circuit 800 of FIG. 8.

Circuit 800 includes a bandgap reference portion including resistors 802, 804, 806, substrate PNP transistors 808 and 810, and an amplifier including PMOS transistors 816 and 818, NMOS transistors 812 and 814, current source 813. A voltage divider includes resistors 824 and 826. Resistor 824 can be made variable to provide hysteresis, using the output of comparator 828 as a control signal. Comparator 828 has a positive input coupled to the drain of transistor 812, and to a negative input coupled to the center tap of the resistor divider at node 820. Inverters 830 and 832 can be interposed between the output of comparator 828 and the output signal node 834 if desired to prolong the duration of the $\overline{POR}$ signal.

It should be emphasized that the definition of the boundaries of the undervoltage, normal operation, and overvoltage regions of the power-on reset and monitoring circuit, since they rely on the voltage thresholds that are defined by the crossing of the bandgap static characteristic and the ratioed supply characteristic, can be set with limited precision. In particular, unless the static bandgap curve versus supply can be controlled, the slope of the ratioed supply characteristic constitutes the only degree of freedom that can be exploited to define the thresholds: therefore, the two thresholds are inherently linked and cannot be set independently. Although the correctness of the positioning of the three regions is ensured by construction, and the functionality of both the undervoltage power-on reset and the overvoltage monitor does not require a high degree of precision, more flexibility in the definition of the threshold voltages would be desirable. The compact circuit disclosed in the present invention can be modified to accommodate these features without increase in power or area, and with moderate complexity. Unlike a combination of the bandgap reference and a multiplicity of comparators and resistor dividers with combinatorial digital logic interpreting the output—which could be realized trivially by implementing a number of prior art solutions—not only the slope of the ratioed supply characteristic curve can be modified, in fact; but the bandgap reference voltage can be ratioed in turn, producing a replica of the non-linear bandgap voltage versus supply characteristic scaled in amplitude, simply by way of a controlled resistive partition. The comparator input does not typically draw any current, hence a simple variable potentiometer (e.g. a digitally controlled switched-resistor ladder in an integrated realization) can be used to add a further degree of freedom to the invention, allowing both thresholds to be adjusted.

Note that the non-linear, saturating nature of the bandgap curve allows for better tunability of the thresholds on the high side (overvoltage detection) than on the low side (undervoltage). This descends from the very nature of the bandgap circuit, and is compatible with the desired functionality of the monitor circuit. Indeed, both a Brokaw-cell and a Widlar-cell based bandgap will provide zero output for low supply voltages (initial dead-zone); until the supply exceeds the combination of BJT's VBE and resistor drops sufficient for the self-regulating loop of the circuit to become operational and stabilize (intermediate rising output); until finally the supply is high enough to ensure the wanted behavior of the bandgap circuit, whose output is constant over supply (final output voltage plateau). The output voltage is the sum of a PTAT (Proportional To Absolute Temperature) voltage drop over a resistor, and a CTAT (Complementary To Absolute Temperature) voltage drop across a p-n semiconductor junction, hence independent from absolute temperature to a first order, and independent from the supply owing to the voltage drops being referred to ground. Though the rising output zone of the characteristic could theoretically be adjusted by tuning the resistance inside the bandgap cell, it is typically more important for the electrical performance of the circuit at large to optimize the output voltage flatness against temperature (which relies on the same circuit parameters): hence a fine-tuning of the bandgap characteristic for sake of a POR operation should be effected by modifying the output directly, rather than altering the Kirchhoff's Voltage Laws balance within the core cell.

In conclusion, this invention combines the best prior art circuit approaches in a novel manner to provide a temperature, and process corner, stable voltage threshold to generate a POR condition for undervoltages; and recognizes that the same circuit can naturally provide an overvoltage protection, by issuing a POR signal that the digital logic can interpret to shut off the most sensitive areas of the I.C. under control, and prevent in so doing either immediate damage, or long-term life-time reduction.

It will be apparent to those skilled in the art that various modifications and variations can be made to the invention without departing from the spirit or scope of the invention. Thus, it is intended that the present invention covers the modifications and variations of this invention provided they come within the scope of the appended claims and their equivalents.

I claim:

1. A method of monitoring supply undervoltage and overvoltage, comprising:
    providing a single reference voltage;
    providing a single ratioed supply voltage;
    comparing the reference voltage to the ratioed supply voltage to provide an output signal, wherein
    the output signal comprises a first logic value in an undervoltage and an overvoltage condition, and a second logic value in a normal operating condition.

2. The method of claim 1 wherein the reference voltage comprises a bandgap voltage.

3. The method of claim 1 wherein the undervoltage condition comprises a condition wherein the reference voltage is less than the ratioed supply voltage for voltages up to a first voltage crossing of the reference voltage and the ratioed supply voltage characteristics.

4. The method of claim 3 wherein the first voltage crossing occurs during a transitional phase of the static characteristic of the reference voltage.

5. The method of claim 1 wherein the overvoltage condition comprises a condition wherein the reference voltage is less than the ratioed supply voltage for voltages greater than a second voltage crossing of the reference voltage and the ratioed supply voltage characteristics.

6. The method of claim 5 wherein the second voltage crossing occurs during either a transitional phase or an invariant phase of the reference voltage.

7. The method of claim 1 wherein the normal operating condition comprises a condition wherein the reference voltage is greater than the ratioed supply voltage for voltages between a first voltage crossing and a second voltage crossing of the reference voltage and the ratioed supply voltage characteristics.

8. The method of claim 1, wherein the method is performed without a clock.

9. The method of claim 1, wherein the reference voltage is generated at a node that is coupled to at least one other component in an integrated circuit.

10. The method of claim 1, wherein the reference voltage comprises an unswitched reference voltage.

11. The method of claim 1, wherein comparing comprises comparing with a single comparator having a first input directly coupled to the ratioed supply voltage and a second input directly coupled to the reference voltage.

12. A method of monitoring supply undervoltage and overvoltage, comprising:
    providing a single reference voltage;
    providing a single ratioed supply voltage;
    comparing the reference voltage to the ratioed supply voltage to provide an output signal,
    wherein the output signal comprises a first logic value in an undervoltage and an overvoltage condition, and a second logic value in a normal operating condition, and wherein
    providing the single reference voltage comprises using an exclusively bipolar, or a mixed bipolar and FET bandgap reference circuit.

13. The method of claim 12 wherein the undervoltage condition comprises a condition wherein the reference voltage is less than the ratioed supply voltage for voltages up to a first voltage crossing of the reference voltage and the ratioed supply voltage characteristics.

14. The method of claim 12 wherein the overvoltage condition comprises a condition wherein the reference voltage is less than the ratioed supply voltage for voltages greater than a second voltage crossing of the reference voltage and the ratioed supply voltage characteristics.

15. The method of claim 12 wherein the normal operating condition comprises a condition wherein the reference voltage is greater than the ratioed supply voltage for voltages between a first voltage crossing and a second voltage crossing of the reference voltage and the ratioed supply voltage characteristics.

16. The method of claim 12 wherein comparing further comprises hysteresis.

17. The method of claim 12 further comprising providing output signal edge delay.

18. A method of monitoring supply undervoltage and overvoltage, comprising:
    providing a single reference voltage, using a substrate PNP bandgap reference circuit;
    providing a single ratioed supply voltage;
    comparing the reference voltage to the ratioed supply voltage to provide an output signal, wherein
    the output signal comprises a first logic value in an undervoltage and an overvoltage condition, and a second logic value in a normal operating condition.

19. The method of claim 18 wherein the undervoltage condition comprises a condition wherein the reference voltage is less than the ratioed supply voltage for voltages up to a first voltage crossing of the reference voltage and the ratioed supply voltage characteristics.

20. The method of claim 18 wherein the overvoltage condition comprises a condition wherein the reference voltage is less than the ratioed supply voltage for voltages greater than a second voltage crossing of the reference voltage and the ratioed supply voltage characteristics.

21. The method of claim 18 wherein the normal operating condition comprises a condition wherein the reference voltage is greater than the ratioed supply voltage for voltages between a first voltage crossing and a second voltage crossing of the reference voltage and the ratioed supply voltage characteristics.

22. The method of claim 18 wherein comparing further comprises hysteresis.

23. The method of claim 18 further comprising providing output signal edge delay.

24. A method of monitoring supply voltage, comprising:
    providing a single reference voltage;
    providing a single ratioed supply voltage;
    comparing the reference voltage to the ratioed supply voltage to provide an output signal, wherein
    the output signal comprises a first logic value in first and second operating conditions, and a second logic value in a third operating condition, wherein the first, second, and third operating conditions are determined by two crossing points of the reference voltage and ratioed supply voltage characteristics, and wherein
    the first operating condition comprises an undervoltage condition, the second operating condition comprises an overvoltage condition, and the third operating condition comprises a normal operating condition.

\* \* \* \* \*